C=

(12) United States Patent
Bousseton et al.

(10) Patent No.: US 7,898,117 B2
(45) Date of Patent: Mar. 1, 2011

(54) MODULAR RACKS AND METHODS OF USE

(75) Inventors: Sebastien Bousseton, La Gaude (FR);
Arnaud Lund, Cagnes-sur-mer (FR)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 12/140,422

(22) Filed: Jun. 17, 2008

(65) Prior Publication Data

US 2009/0290312 A1    Nov. 26, 2009

(30) Foreign Application Priority Data

May 22, 2008   (EP) .................................... 08305192

(51) Int. Cl.
*H02B 13/00*    (2006.01)
(52) U.S. Cl. ............................................. 307/156
(58) Field of Classification Search ................. 307/156
See application file for complete search history.

(56) References Cited

U.S. PATENT DOCUMENTS

| | | | | |
|---|---|---|---|---|
| 3,217,671 | A * | 11/1965 | Walsh ............................. | 108/91 |
| 3,896,743 | A * | 7/1975 | Pariente ......................... | 108/190 |
| 4,706,824 | A * | 11/1987 | Mercer et al. ................. | 211/188 |
| 5,158,187 | A * | 10/1992 | Taub .............................. | 211/186 |
| 5,398,159 | A * | 3/1995 | Andersson et al. ........... | 361/695 |
| 5,433,326 | A * | 7/1995 | Horian ........................... | 211/188 |
| 5,685,439 | A * | 11/1997 | Luenser ......................... | 211/183 |
| 5,722,544 | A * | 3/1998 | Williams ....................... | 211/188 |
| 5,777,845 | A * | 7/1998 | Krum et al. .............. | 361/679.34 |
| 6,230,632 | B1 * | 5/2001 | Moore ........................... | 108/180 |
| 6,564,571 | B2 * | 5/2003 | Feeney .......................... | 62/259.2 |
| 6,600,665 | B2 * | 7/2003 | Lauchner ....................... | 361/826 |
| 6,741,463 | B1 | 5/2004 | Akhtar et al. | |
| 6,749,070 | B2 * | 6/2004 | Corbett et al. ................ | 211/26 |
| 6,836,030 | B2 | 12/2004 | Smith et al. | |
| 6,870,095 | B1 * | 3/2005 | Whitted ......................... | 174/481 |
| 6,909,611 | B2 * | 6/2005 | Smith et al. ................... | 361/727 |
| 6,985,357 | B2 * | 1/2006 | Cauthron ....................... | 361/724 |
| 7,028,195 | B2 * | 4/2006 | Kasprzak et al. ............. | 713/300 |
| 7,239,509 | B1 | 7/2007 | Roeske | |
| 7,327,563 | B2 * | 2/2008 | Cauthron ................. | 361/679.55 |
| 7,355,847 | B2 * | 4/2008 | Coglitore et al. ........ | 361/679.48 |
| 7,364,475 | B2 * | 4/2008 | Curtis et al. .................. | 439/700 |
| 7,420,805 | B2 * | 9/2008 | Smith et al. ............. | 361/679.48 |
| 7,594,628 | B2 * | 9/2009 | Yang et al. ..................... | 248/58 |
| 7,646,590 | B1 * | 1/2010 | Corhodzic et al. ............ | 361/641 |
| 2002/0007464 | A1 * | 1/2002 | Fung .............................. | 713/320 |
| 2003/0065958 | A1 * | 4/2003 | Hansen et al. ................ | 713/300 |
| 2004/0264112 | A1 | 12/2004 | Koehler et al. | |
| 2005/0021704 | A1 | 1/2005 | Larson et al. | |
| 2007/0025075 | A1 | 2/2007 | Arippol | |
| 2008/0060953 | A1 * | 3/2008 | Ghassan ........................ | 206/216 |
| 2009/0034167 | A1 * | 2/2009 | Rasmussen et al. .......... | 361/627 |

* cited by examiner

*Primary Examiner* — Jared J Fureman
*Assistant Examiner* — Adi Amrany
(74) *Attorney, Agent, or Firm* — Schmeiser, Olsen & Watts; John Pivnichny

(57) ABSTRACT

A structural configuration which includes a computer support structure having at least one module supporting a computer server disposed therein, and methods for connecting servers and using a computer support structure. Each module includes at least one support member separating the module from each adjacent module. The support member is configured to simultaneously conduct both power and data to a computer server located in the module. The method for connecting servers includes placing a first server inside a first module which includes a first structural member configured to conduct electrical power and data to the first server. A second server is placed inside a second module which includes a second structural member. The second module is placed on top of the first module. The first member supports the second module and separates the second module from the first module, resulting in the first member connecting to the second member.

12 Claims, 9 Drawing Sheets

MODULAR RACKS AND METHODS OF USE

FIELD OF THE INVENTION

The invention generally relates to computer server systems, more specifically to storage and connections of computer server systems.

BACKGROUND OF THE INVENTION

Current computer server systems utilize servers stored in a rack structure which holds multiple computer servers. When a rack mountable computer server is installed in a server rack structure, numerous cables must be connected to the server so that the server can function correctly and communicate with other computer systems and peripherals. These cables may include power cords, video cables, keyboard and mouse cables, SCSI cables, USB cables, networking cables, and other appropriate types of cabling required for server operation. The installation and removal of a server from the server rack structure is a time consuming task due to the time required for cabling, decabling, and recabling activities. There exists a need for a system and methods for efficient installation and removal of computer servers.

SUMMARY OF THE INVENTION

The present invention relates to a structural configuration, comprising:

a support structure that includes at least one module, each module of said at least one module supporting a computer server disposed therein, said each module comprising at least one support member separating said each module from each adjacent module, said at least one support member configured to transmit simultaneously both power and data to said computer server.

The present invention relates to a method for connecting computer servers, comprising:

placing a first computer server inside a first module, said first module supporting said first computer server, said first module comprising a first structural member configured to conduct both electrical power and data to said first computer server operatively coupled to said first structural member;

placing a second computer server inside a second module, said second module supporting said second computer server, said second module comprising a second structural member configured to conduct both power and data to said second computer server operatively coupled to said second structural member; and placing said second module on top of said first module, said first structural member supporting said second module and separating said second module from said first module, resulting in said first structural member connecting electrically to said second structural member.

The present invention relates to a method for using a computer server support structure, comprising:

providing a server support structure comprising a plurality of modules, each module of said plurality of modules supporting a computer server disposed therein, said each module comprising at least one support member separating said each module from each adjacent module, said at least one support member coupled to a support member of an adjacent module of said plurality of modules, said at least one support member configured to transmit both power and data to said adjacent support member;

electrically connecting a first computer server of a first module of said plurality of modules to a first support member of said first module;

connecting a first data cable from said first computer server to said first support member;

electrically connecting a second computer server of a second module of said plurality of modules to a second support member of said second module, said second support member physically coupled to said first support member;

connecting a second data cable from said second computer server to said second support member; and transmitting simultaneously electrical power and data to said first support member, resulting in transmitting electrical power to said first computer server and to said second computer server, and resulting in transmitting a first portion of said data to said first computer server and a second portion of said data to said second computer server.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
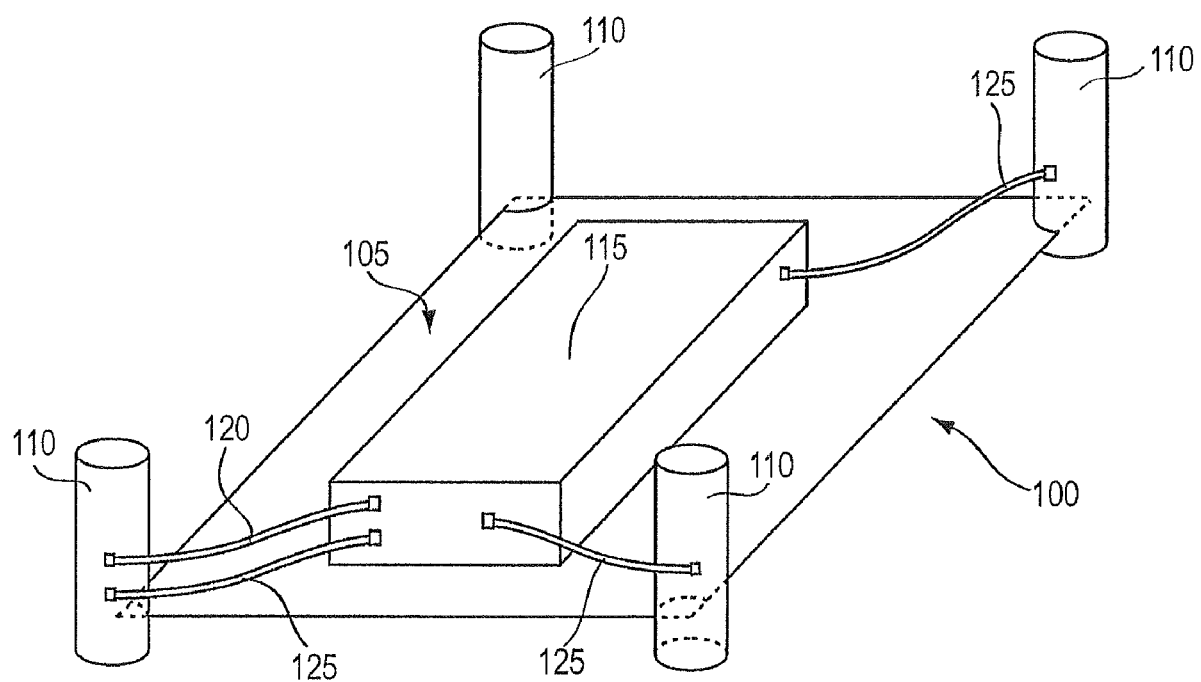
FIG. 1 is an illustration of a support structure comprising a module configured to support a computer server, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

FIG. 1 is an illustration of an example of a support structure comprising a module 100 configured to support a computer server 115. The module 100 may comprise at least one support member 110. The module 100 may comprise a platform or base 105 on which a computer server 115 may be disposed. The at least one support member 110 may comprise an interconnect member configured to simultaneously transmit both power and data to and from the computer server 115, such as via at least one power cable 120 which transmits the electrical power which operates the server 115, and via at least one data cable 125 which transmits data to the server 115 which the server may process.

Figure 2:
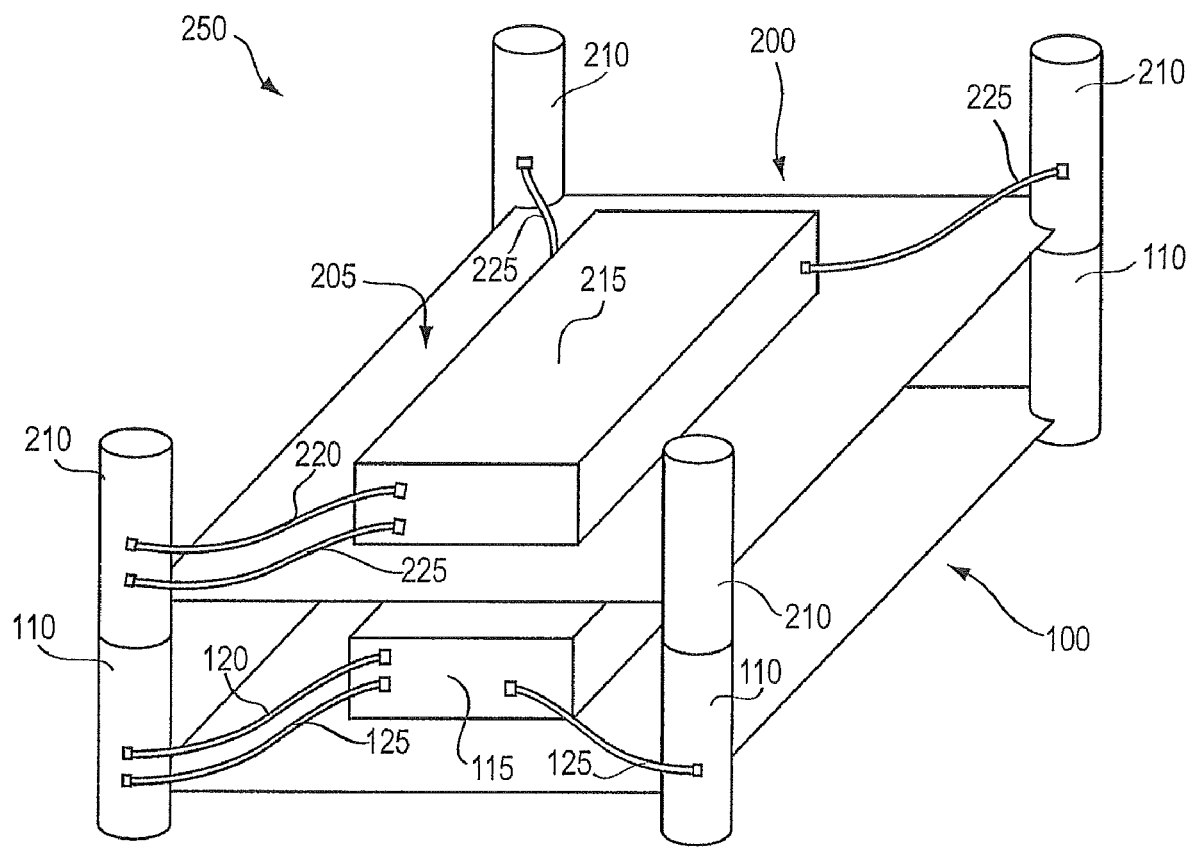
FIG. 2 is an illustration of an example of a support structure comprising at least one module, in accordance with embodiments of the present invention.

FIG. 2 is an illustration of an example of a support structure 250 comprising at least one module configured to support a computer server 115. A support structure as described herein may comprise a plurality of modules. The example of a support structure 250 illustrated in FIG. 2 comprises the module 100 of FIG. 1 and a second module 200 disposed on top of and connected to the first module 100. The second module may comprise a platform or base 205 on which a computer server 215 may be disposed. The at least one support member 110 of the first module 100 and the at least one support member of the second module 200 may separate the module 100 from the adjacent second module 200. The support members 110 and 210 may comprise interconnect members configured to simultaneously transmit both data and power. The at least one support member 210 may comprise an interconnect member configured to simultaneously transmit both power and data to and from the computer server 215, such as via at least one power cable 220 and at least one data cable 225, respectively.

In some embodiments, the at least one module comprises a plurality of modules stacked vertically, where the at least one support member of each module may support other modules stacked above said each module. The support members may comprise interconnect members where the interconnect members connect each module to each adjacent module, and where the interconnect members are configured to simultaneously transmit both power and data.

Figure 3:
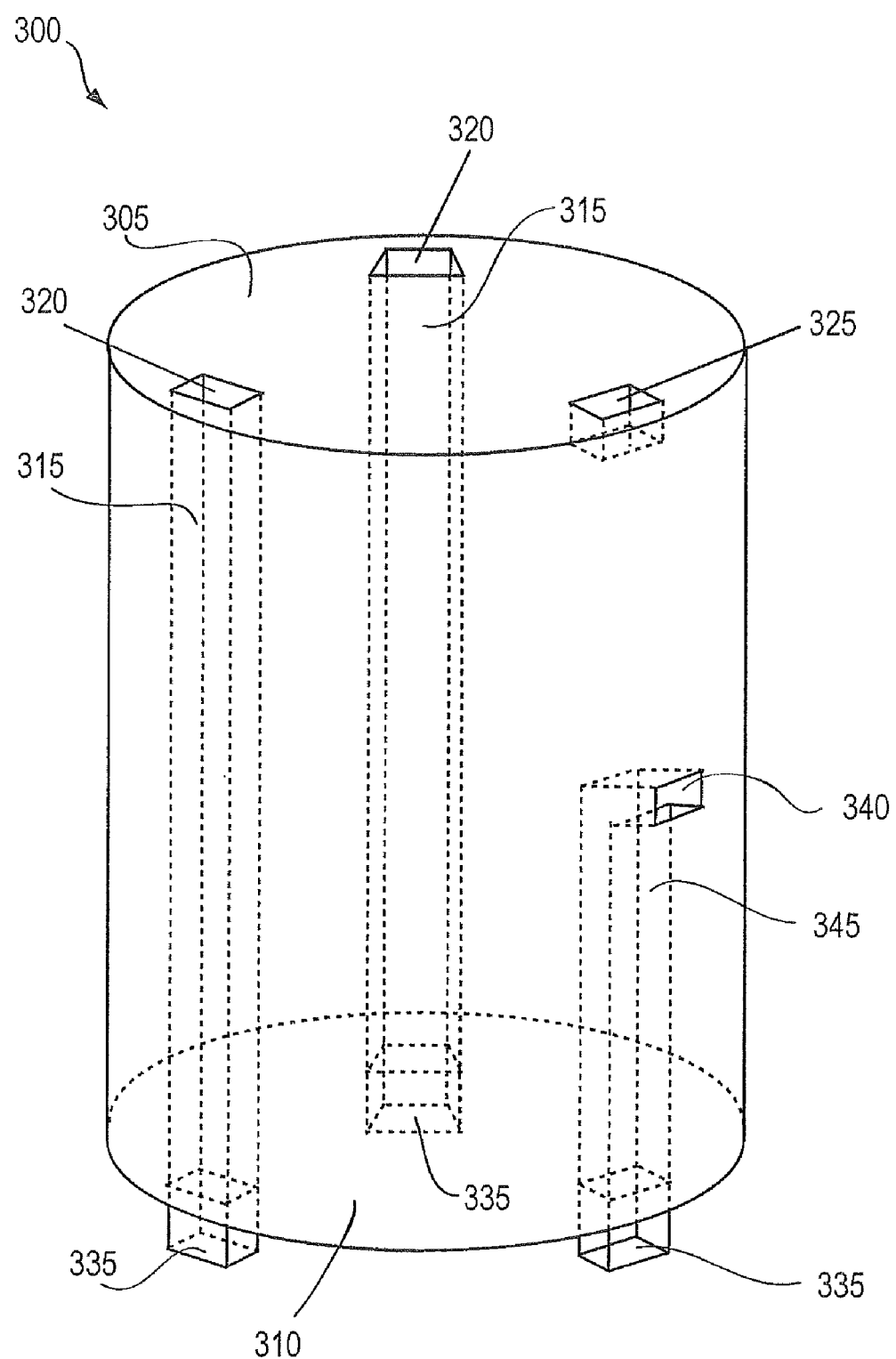
FIG. 3 is an illustration of an example of a support member, in accordance with embodiments of the present invention.

FIG. 3 is an illustration of an example of a support member 300 as described above, where the support member 300 comprises an interconnect member configured to transmit both power and data. The interconnect member may comprise a plurality of connection cables 320, such as data cables and at least one power cable, where the data cables may be configured to transmit data, and the power cable may be configured to transmit power. Data cables as used herein, may comprise any type of cable or line capable of transmitting data. Examples of data cables include coaxial cables, fiber optic cables, shielded twisted pair (STP) cables, unshielded twisted pair (UTP) cables, and combinations thereof. The interconnect member may comprise electrical and data connectors on each end of the interconnect member to facilitate data and electrical and data connections between adjacent connected modules. The example illustrated in FIG. 3 shows a support member 300 having a first end 305 having female connectors 320 and a second end 310 having male connectors 335, connected to cables 315 disposed inside the support member, such that a plurality of such support members stacked end to end would connect via the appropriate connector type.

The connectors may comprise any connector type known to those skilled in the art for connecting power and/or data cables, such as RJ45 connectors for connecting data cables. For example, the interconnect member may comprise a cylindrical member having a plurality of male RJ45 connectors disposed on a first end of the cylindrical member and connected through the plurality of data cables to a plurality of female RJ45 connectors on a second end of said cylindrical member.

The interconnect member may comprise at least one side-exiting connector 340 to which a computer server or other component supported on the support structure may be connected. The at least one side-exiting connector 340 may connect to a source cable 345 which connects to a power source or data source and does not connect to a connector of an adjacent modules stacked above it.

The interconnect member may comprise at least one terminating or "blind" connector 325, which does not connect to a cable within the interconnect member and may be used to terminate a connection from an adjacent connected module, or as a placeholder to allow stacking of adjacent modules without providing an electrical or data connection through the corresponding connection in the adjacent module.

The support members described above may further comprise an interconnect adapter disposed between a first interconnect member and an interconnect member of an adjacently connect module. An interconnect adapter may be used to align cables and connectors of adjoining modules providing continuous circuits of data and power cables, as described below.

Figure 4:
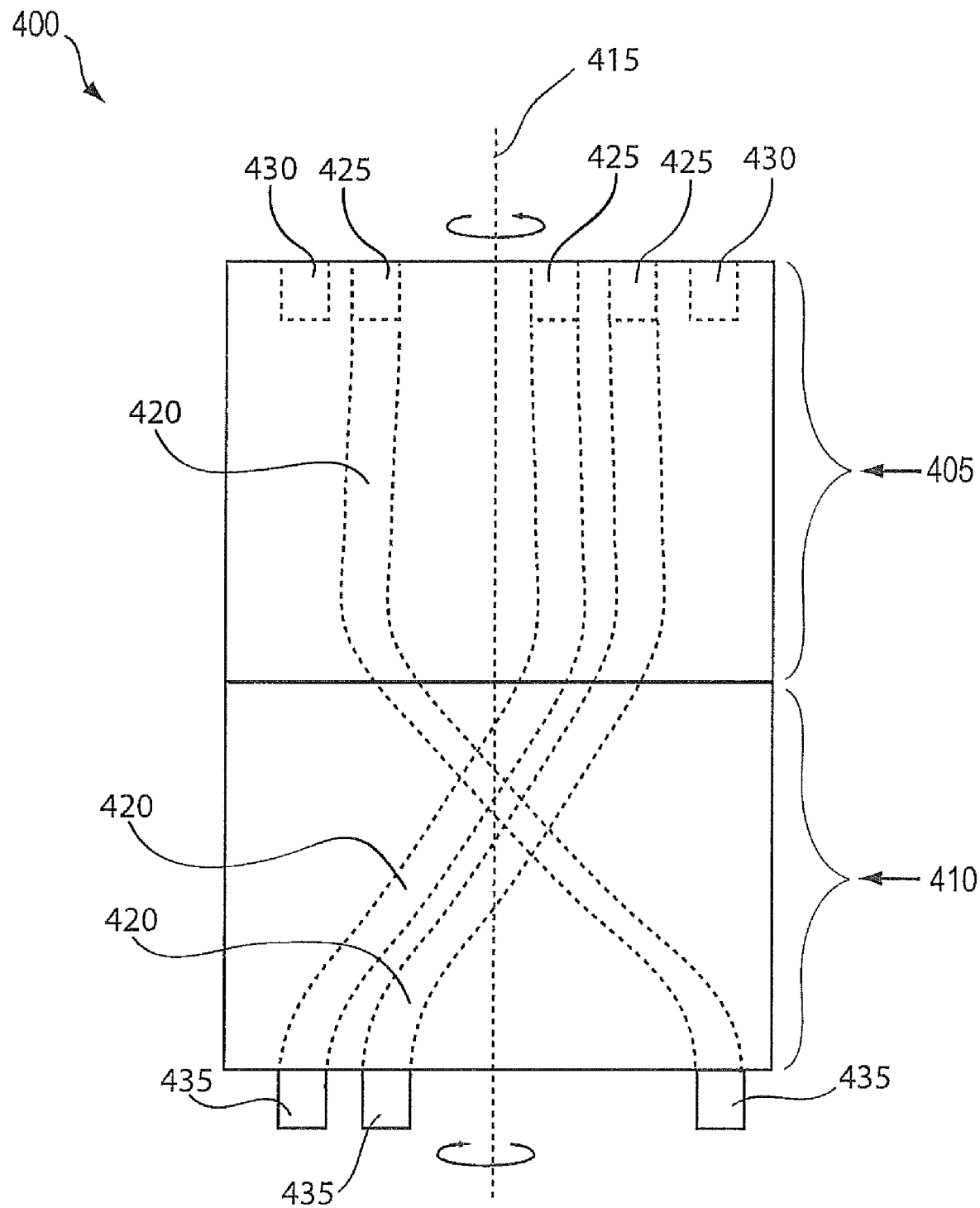
FIG. 4 is an illustration of a side view of an example of a cylindrical interconnect adapter, in accordance with embodiments of the present invention.

FIG. 4 is an illustration of a side view of an example of a cylindrical interconnect adapter 400 having an axis of rotation 415, where a first half 405 of the interconnect adapter 400 may be rotated in a first direction with respect to the axis 415, and a second half 410 of the interconnect adapter 400 may be rotated in a second direction opposite to the first direction, with respect to the axis 415. The interconnect adapter 400 may comprise a plurality of connection cables 420, such as the connection cables described above. The cables 420 may connect female connectors 425 on the first half 405 of the interconnect member 400, with male connectors 435 on the second half 410 of the interconnect member 400. The interconnect member 400 may comprise at least one "blind" female connector 430.

Rotation of the first half 405 of the interconnect adapter 400, about axis 415, in an opposite direction as the second half 410, allows for the rotation of cables to line up connectors in a first interconnect member with connectors in an adjoining adjacent interconnect member.

Figure 5:
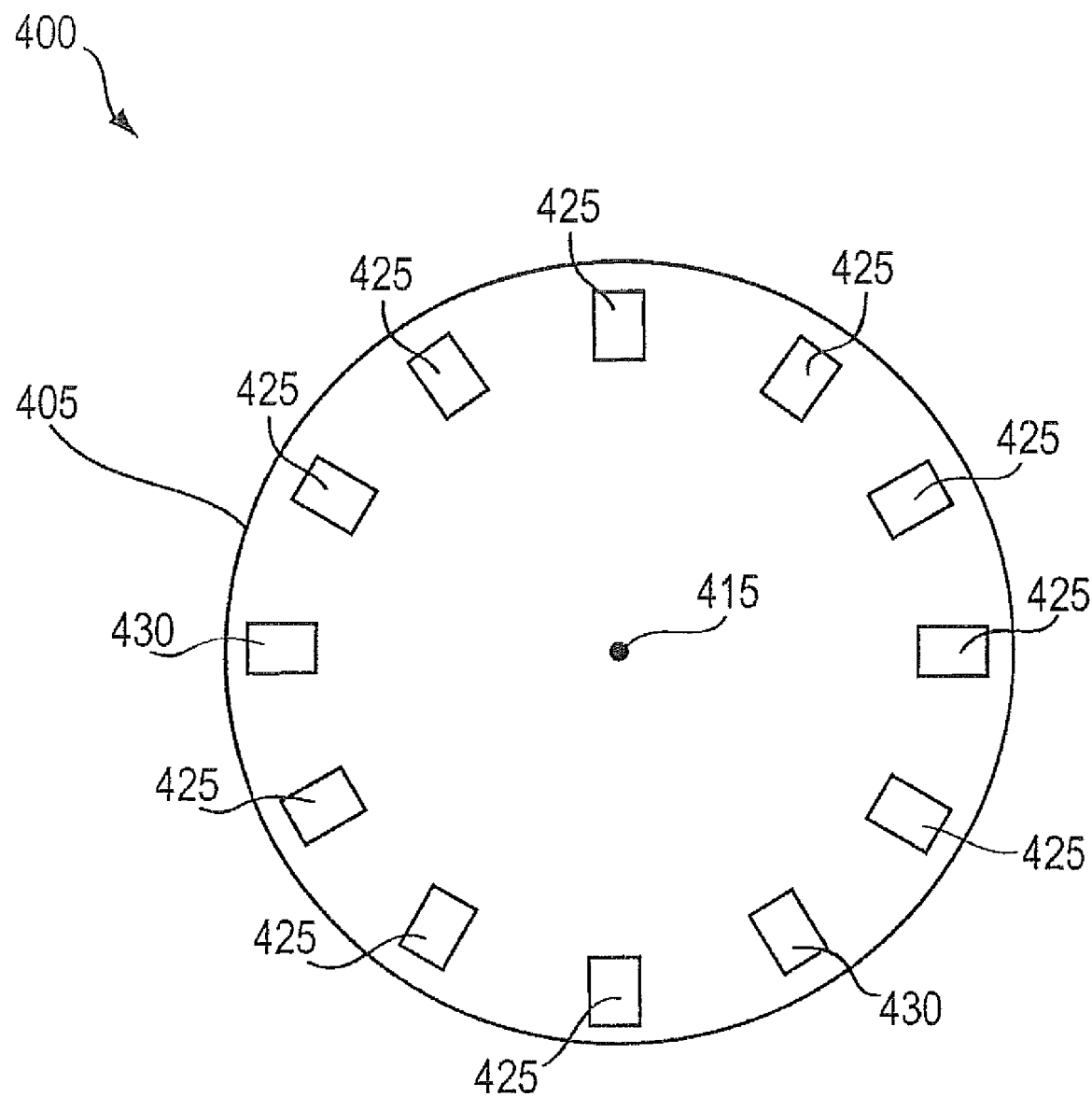
FIG. 5, is a top view of the first half of the interconnect member illustrated in FIG. 4, in accordance with embodiments of the present invention.

FIG. 5, is a top view of the first half 405 of the interconnect member 400 illustrated in FIG. 4, showing a plurality of female connectors 425 and a plurality of "blind" female connectors 430.

Figure 6A:
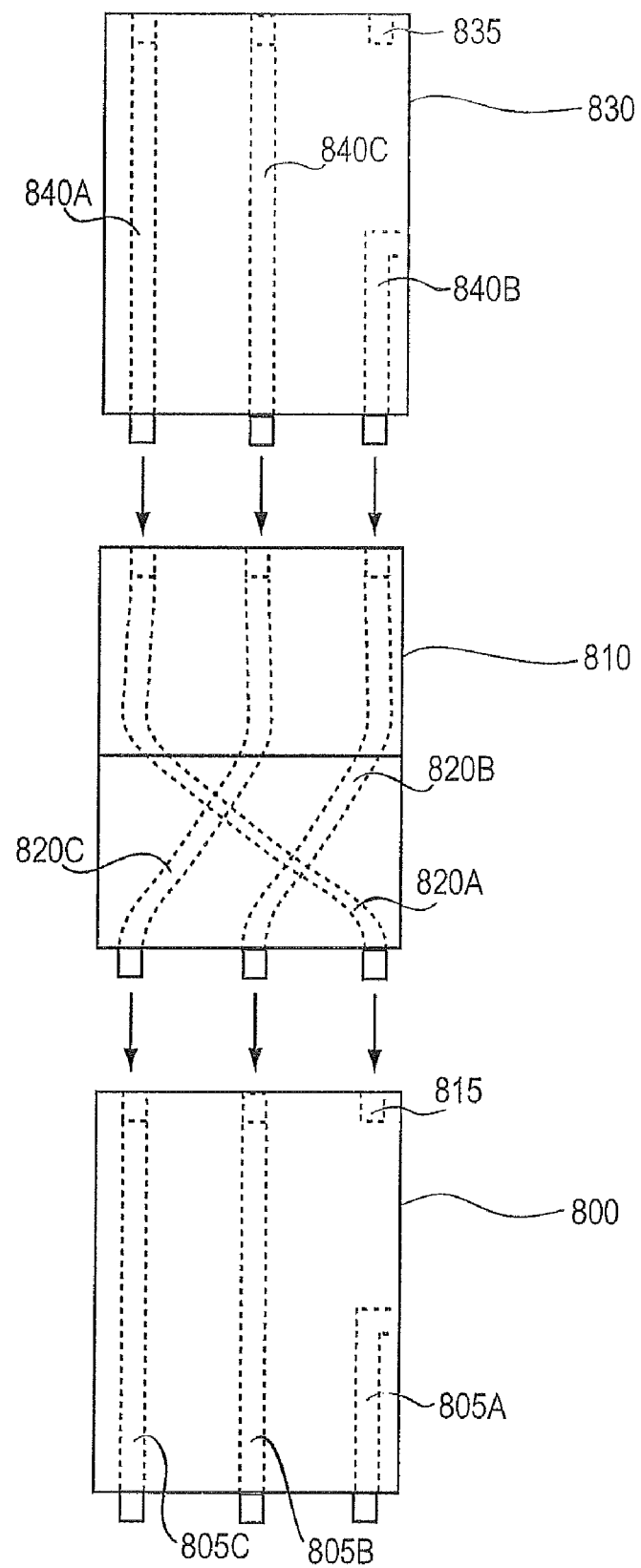
FIG. 6A is an illustration showing an example of how an interconnect adapter may connect to a first interconnect member and a second interconnect member, in accordance with embodiments of the present invention.

FIG. 6A is an illustration showing an example of how an interconnect adapter 810 may connect to a first interconnect member 800 and a second interconnect member 830. The first interconnect member 800 comprises cables 805A, 805B, and 805C, and blind connector 815. Cable 805A is a side-exiting cable. The second interconnect member 830 comprises cables 840A, 840B, and 840C, and blind connector 835. Cable 840B is a side-exiting cable. The interconnect adapter comprises cables 820A, 820B, and 820C. When connected as indicated in FIG. 6, cable 805B connects through cable 820B to cable 840B, and cable 805C connects through cable 820C to cable 840C. The use of the interconnect adapter 810 in between interconnect members, allows for the continued connection of cable such as 840B which would terminate if connected directly to interconnect member 800.

Figure 6B:
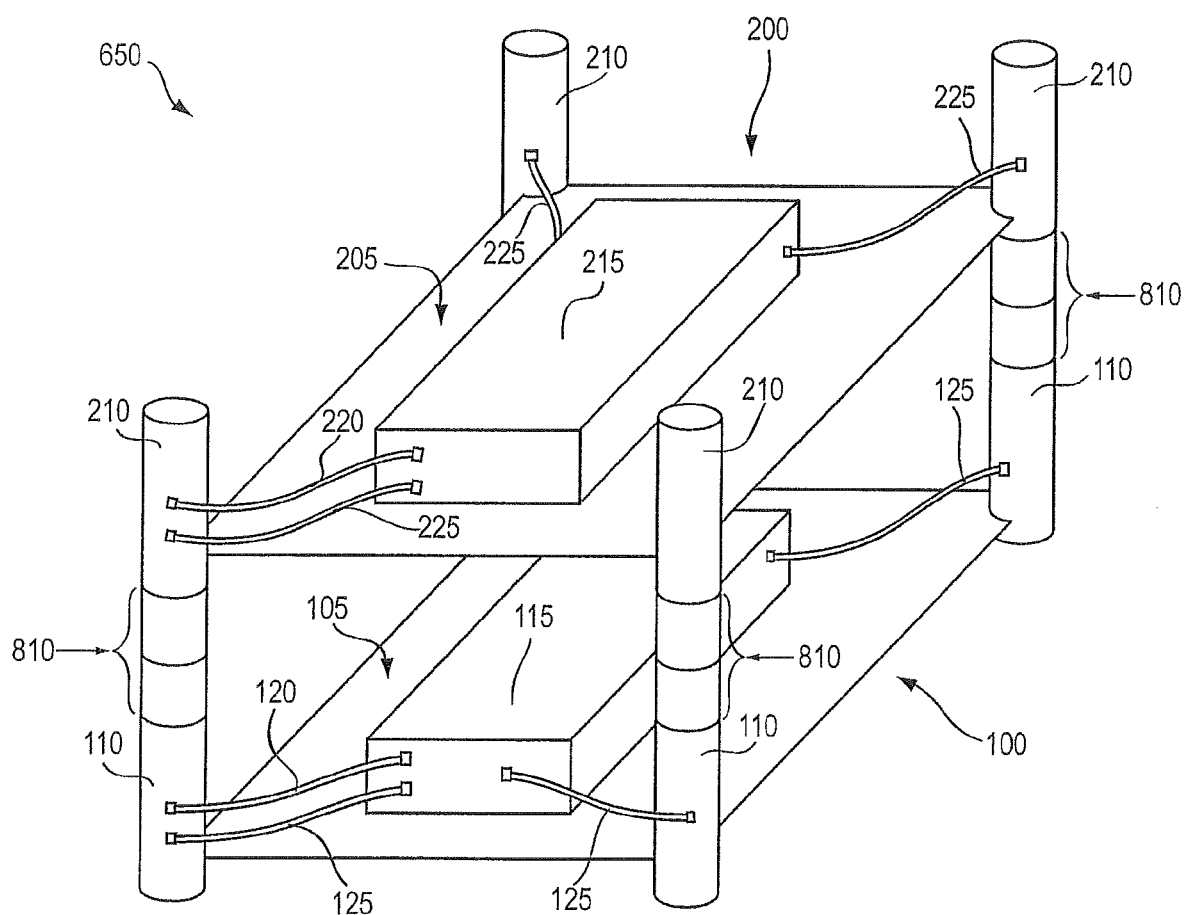
FIG. 6B is an illustration of an example of a support structure comprising module 100 and module 200 illustrated in FIG. 2 and further comprising interconnect adapters illustrated in FIG. 6A, in accordance with embodiments of the present invention.

FIG. 6B is an illustration of an example of a support structure 650 comprising module 100 and module 200 illustrated in FIG. 2, and further comprising interconnect adapters 810 illustrated in FIG. 6A, where the interconnect adapters 810 are connected to and disposed between support members 210 and support members 110. The interconnect adapters 810 may transmit data and electrical power between support members 210 and support members 110.

Figure 7:
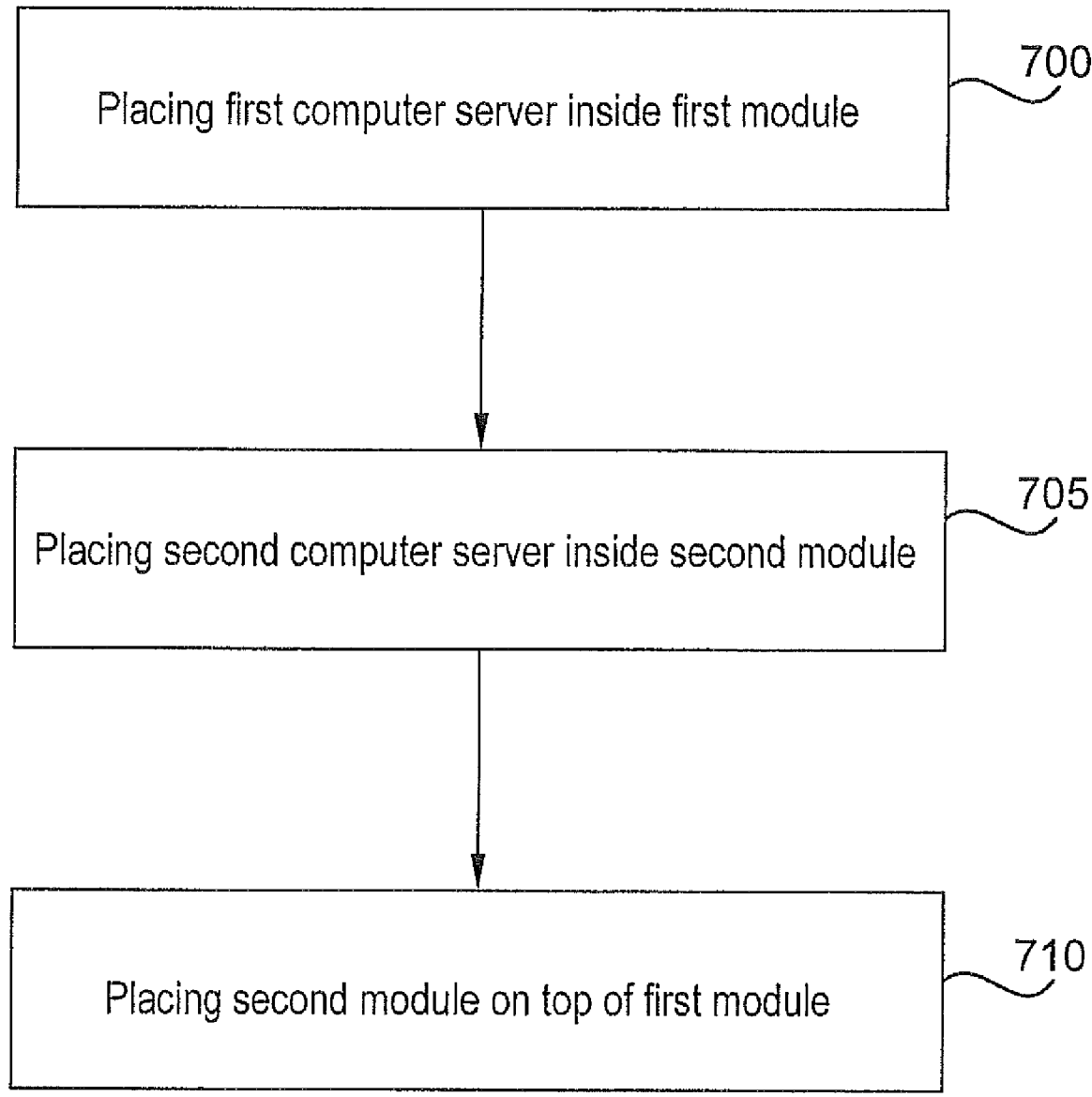
FIG. 7 is a flow chart illustrating a method for connecting computer servers, in accordance with embodiments of the present invention.

FIG. 7 is a flow chart illustrating a method for connecting computer servers. Step 700 comprises placing a first computer server inside a first module, where the first module supports the first computer server. The first module may comprise a first structural member configured to conduct both electrical power and data to the first computer server operatively coupled to the first structural member. The first structural member may be as described above, where the structural member may comprise a plurality of data cables, at least one power cable, or combination of these. Each data cable may be configured to transmit data, and the at least one power cable may be configured to transmit power.

Step 705 comprises placing a second computer server inside a second module, where the second module supports the second computer server. The second module may comprise a second structural member configured to conduct both power and data to the second computer server operatively coupled to the second structural member. The second structural member may be as described above for the first structural member.

Step 710 comprises placing the second module on top of the first module, where the first structural member supports the second module and separates the second module from the first module, resulting in the first structural member connecting electrically to the second structural member. FIG. 2 illustrates an example of a first module 200 stacked vertically on top of a second module 100 as described in step 710.

The method illustrated in FIG. 7 may further comprise stacking one or more additional modules on top of the second module, where the additional modules each have a computer server disposed therein and operatively connected to the module. Rearrangement of the stacked computer servers may be accomplished by a user by lifting off one or more of the stacked servers and rearranging the modules in a desired order. Since the connections between modules are accomplished upon stacking, the connections (e.g. cabling) between modules and their corresponding servers need not be changed to rearrange the order or number of computer servers in the stack.

The method illustrated in FIG. 7 may further comprise connecting an electrical power source to the first structural member, and transmitting electrical power from the electrical power source to the first computer server and to the second computer server. A continuous electrical connection between the first structural member and the second structural member allows for the transmission of electrical power to the second structural member, such as through power cables as described above. Operative coupling between the computer servers and structural members described above may comprise, for example, connections via power cables, data cables, or a combination of these.

The method illustrated in FIG. 7 may further comprise connecting a data cable to the first structural member, and transmitting data through the data cable to the first computer server and to the second computer server. A continuous data connection between the first structural member and the second structural member allows for the transmission of data to the second structural member, such as through a plurality of data cables disposed inside the structural member as described above. Transmitting may, for example, comprise transmitting the data to a repeater, where the repeater amplifies the signal power of the data, followed by the repeater transmitting the amplified data signal to the first structural member through the data cable.

The method illustrated in FIG. 7 may further comprise connecting an electrical power source and a data cable to the first structural member, and transmitting simultaneously both power and data to the first computer server and to the second computer server. Since the structural members may comprise both data and power cables, both data and power may be transmitted through the support structure simultaneously to adjacent support structures, to operatively coupled servers, or a combination of these.

The method illustrated in FIG. 7 may further comprise, after placing the second module on top of the first module, disconnecting the first computer server from the first structural member and removing the first computer server from inside the first module, where the first structural member remains electrically connected to said second structural member during the removing. As described above, the continuous electrical and data connections between the first and second structural members, allows for the removal of servers connected to the structural members without disconnecting the electrical and data connections between structural members. For example, the first server may be removed and replaced by a third server without disruption of either electrical power or data connections to the second server operatively coupled to the second structural member.

Figure 8:
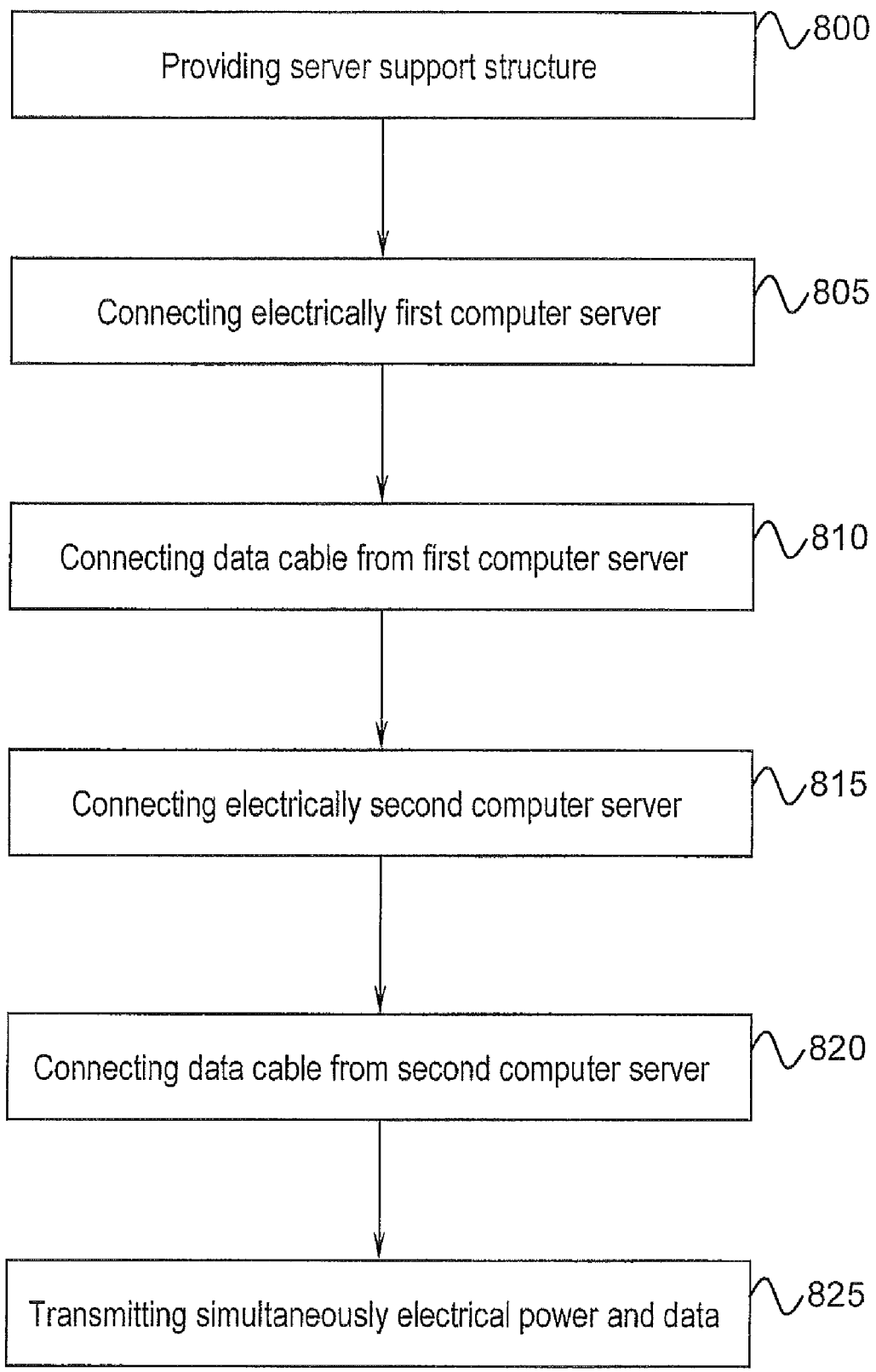
FIG. 8 is a flow chart illustrating a method for using a computer server support structure, in accordance with embodiments of the present invention.

FIG. 8 is a flow chart illustrating a method for using a computer server support structure. Step 800 comprises providing a server support structure comprising a plurality of modules. Each module of the plurality of modules may support a computer server disposed therein. Each module may comprise at least one support member separating each module from each adjacent module. The at least one support member may be coupled to a support member of an adjacent module of the plurality of modules. The at least one support member may be configured to transmit both power and data to adjacent support members. For example, the modules and support members may comprise modules and support members as described above, Step 805 comprises connecting electrically a first computer server of a first module of the plurality of modules to a first support member of the first module. For example, connecting electrically may comprise connecting a power cable from the first computer server to a side-exiting power connector on the first support member.

Step 810 comprises connecting a first data cable from the first computer server to the first support member. For example, the first data cable may comprise a data cable as described above, where the data cable may be connected from the server to a side-exiting data connection on the first support member.

Step 815 comprises connecting electrically a second computer server of a second module of the plurality of modules to a second support member of the second module. The second support member may be physically coupled to the first support member, such as directly connected through male/female connectors as described above.

Step 820 comprises connecting a second data cable from the second computer server to the second support member. The second data cable may comprise a data cable as described above, where the second data cable may be connected from the server to a side-exiting data connection on the second support member.

Step 825 comprises transmitting simultaneously electrical power and data to the first support member, resulting in transmitting simultaneously electrical power to the first computer server and to the second computer server, and resulting in transmitting a first portion of the data to the first computer server and a second portion of the data to the second computer server. For example, the first support member may comprise a first interconnect member, such as those described above, where the first interconnect member has a first plurality of data cables. A first data cable of the first plurality of data cables may transmit the first portion of the data to the first computer server, such as via a cable connected from the first server to a side-exiting connector to which the first data cable is connected. Further, the second support member may comprise a second interconnect member having a second plurality of data cables. A second data cable of the first plurality of cables may connect to a third data cable of the second plurality of data cables, and transmit the second portion of the data to third data cable. The third data cable may transmit the second portion of the data to the second computer server, such as via a cable connected from the second server to a side-exiting connector, to which the third data cable is connected. The first interconnect member may have at least one power cable, where the at least one power cable transmits the electrical power to the second support member.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A structural configuration, comprising:
    a support structure that includes at least one module, each module of said at least one module supporting a computer server disposed therein, said each module comprising at least one support member separating said each module from each adjacent module, said at least one support member configured to transmit simultaneously both power and data to said computer server;
    wherein said at least one module comprises a plurality of modules;
    wherein the at least one support member comprises a plurality of sets of multiple support members;
    wherein corresponding support members in successive sets of multiple support members are aligned directly above or below each other and are mechanically coupled to each other, and
    wherein each support member of the multiple support members in each set comprises a plurality of data cables and at least one power cable such that each data cable of said plurality of data cables is configured to transmit data and each power cable of said at least one power cable is configured to transmit power,
    wherein the support structure further comprises a plurality of interconnect adapters;
    wherein the corresponding support members in successive sets of multiple support members that are aligned directly above or below each other are mechanically coupled to each other by being in direct mechanical connection with respective opposite ends of an interconnect adapter of the plurality of interconnect adapters,
    wherein each interconnect adapter has an axis of rotation;
    wherein each interconnect adapter to which corresponding support members are connected at opposite ends thereof comprises a first half and a second half in mechanical connection with said corresponding support members;
    wherein the first half of each interconnect adapter is configured to be rotated in a first direction with respect to the axis of rotation;
    wherein the second half of each interconnect adapter is configured to be rotated in a second direction with respect to the axis of rotation; and
    wherein the second direction is opposite the first direction.

2. The structural configuration of claim 1, wherein each support member comprises a cylindrical member having a plurality of male RJ45 connectors disposed on a first end of said cylindrical member and connected through said plurality of data cables to a plurality of female RJ45 connectors on a second end of said cylindrical member.

3. The structural configuration of claim 1,
    wherein each module comprises a platform;
    wherein the computer server supported by each module is disposed on and in direct mechanical contact with the platform comprised by said each module; and
    wherein each support member of each set of multiple support members is mechanically connected to a different corner of the platform comprised by said each module.

4. A method for connecting computer servers, said method comprising:
    placing a first computer server inside a first module, said first module supporting said first computer server, said first module comprising a first structural member configured to conduct both electrical power and data to said first computer server operatively coupled to said first structural member;
    placing a second computer server inside a second module, said second module supporting said second computer server, said second module comprising a second structural member configured to conduct both power and data to said second computer server operatively coupled to said second structural member; and
    placing said second module on top of said first module, said first structural member supporting said second module and separating said second module from said first module, resulting in said first structural member connecting electrically to said second structural member;
    physically coupling the first and second structural members to each other by placing the first and second structural members in direct mechanical connection with respective opposite ends of an interconnect adapter, which results in the first and second structural members being aligned directly above or below each other; and
    inserting a plurality of data cables and at least one power cable within each structural member of the first and second structural members, wherein each data cable of the plurality of data cables is configured to transmit data, and wherein each power cable of the at least one power cable is configured to transmit power;
    wherein the interconnect adapter has an axis of rotation;
    wherein the interconnect adapter comprises a first half and a second half in respective mechanical connection with the first structural member and the second structural member;
    wherein the first half of the interconnect adapter is configured to be rotated in a first direction with respect to the axis of rotation;
    wherein the second half of the interconnect adapter is configured to be rotated in a second direction with respect to the axis of rotation; and
    wherein the second direction is opposite the first direction.

5. The method of claim 4, said method further comprising:
    connecting an electrical power source to said first structural member; and transmitting electrical power from said electrical power source to said first computer server and said second computer server, said first structural member conducting said electrical power to said first computer server and said second structural member, said second structural member conducting said electrical power to said second computer server.

6. The method of claim 4, said method further comprising: connecting a data cable to said first structural member; and transmitting data through said data cable to said first computer server and to said second computer server, said first structural member transmitting said data to said first computer server and said second structural member, said second structural member transmitting said data to said second computer server.

7. The method of claim 4, wherein said first structural member comprises said plurality of data cables and said at least one power cable, each data cable of said plurality of data cable configured to transmit data, said power cable configured to transmit power.

8. The method of claim 4, said method further comprising: connecting an electrical power source and a data cable to said first structural member; and
transmitting simultaneously both power and data to said first computer server and to said second computer server, said first structural member conducting simultaneously both said electrical power and said data to said first computer server and said second structural member, said first structural member conducting simultaneously both said electrical power and said data to said first computer server and said second structural member, said second structural member conducting simultaneously both said electrical power and said data to said second computer server.

9. The method of claim 4, wherein the first module and the second module respectively comprise a first platform and a second platform, and wherein the method further comprises:
disposing the first computer server and the second computer server on and in direct mechanical contact with the first platform and the second platform, respectively;
coupling the first and second structural member to the first and second module such that the first and second structural member is mechanically connected to a corner of the first and second platform, respectively; and
inserting a plurality of data cables and at least one power cable within each structural member of the first and second structural members, wherein each data cable of the plurality of data cables is configured to transmit data, and wherein each power cable of the at least one power cable is configured to transmit power.

10. A method for using a computer server support structure, said method comprising:
providing a server support structure comprising a plurality of modules, each module of said plurality of modules supporting a computer server disposed therein, said each module comprising at least one support member separating said each module from each adjacent module, said at least one support member coupled to a support member of an adjacent module of said plurality of modules, said at least one support member configured to transmit both power and data to said adjacent support member;
electrically connecting a first computer server of a first module of said plurality of modules to a first support member of said first module;
connecting a first data cable from said first computer server to said first support member;

electrically connecting a second computer server of a second module of said plurality of modules to a second support member of said second module, said second support member physically coupled to said first support member;
connecting a second data cable from said second computer server to said second support member; and
transmitting simultaneously electrical power and data to said first support member, resulting in transmitting electrical power to said first computer server and to said second computer server, and resulting in transmitting a first portion of said data to said first computer server and a second portion of said data to said second computer server;
wherein the server support structure further comprises an interconnect adapter;
wherein the first and second support members are physically coupled to each other by being in direct mechanical connection with respective opposite ends of the interconnect adapter;
wherein the first support member comprises a first plurality of data cables and a first at least one power cable;
wherein the second support member comprises a second plurality of data cables and a second at least one power cable;
wherein each plurality of data cables of the first plurality of data cables and the second plurality of data cables is configured to transmit data;
whereon each at least one power cable of the first at least one power cable and the second at least one power cable is configured to transmit power
wherein said transmitting the first portion of said data to the first computer server comprises transmitting via a first data cable of the first plurality of data cables the first portion of said data to the first computer server;
wherein the interconnect adapter has an axis of rotation,
wherein the interconnect adapter comprises a first half and a second half in respective mechanical connection with the first support member and the second support member,
wherein the first half of the interconnect adapter is configured to be rotated in a first direction with respect to the axis of rotation,
wherein the second half of the interconnect adapter is configured to be rotated in a second direction with respect to the axis of rotation, and
wherein the second direction is opposite the first direction.

11. The method of claim 10,
wherein the first and second modules respectively comprise a first and second platform,
wherein the first and second computer servers are respectively disposed on and in direct mechanical contact with the first and second platforms;
wherein the first and second support members are coupled to the first and second modules via the first and second support members being mechanically connected to a corner of the first and second platform, respectively;
wherein the first and second support members are aligned directly above or below each other;
wherein the first support member comprises a first plurality of data cables and a first at least one power cable;
wherein the second support member comprises a second plurality of data cables and a second at least one power cable;
wherein each plurality of data cables of the first plurality of data cables and the second plurality of data cables is configured to transmit data; and whereon each at least one power cable of the first at least one power cable and the second at least one power cable is configured to transmit power.

12. A structural configuration, comprising:

a support structure that includes at least one module, each module of said at least one module supporting a computer server disposed therein, said each module comprising at least one support member separating said each module from each adjacent module, said at least one support member configured to transmit simultaneously both power and data to said computer server:

wherein said at least one module comprises a plurality of modules;

wherein the at least one support member comprises a plurality of sets of multiple support members:

wherein corresponding support members in successive sets of multiple support members are aligned directly above or below each other and are mechanically coupled to each other, and wherein each support member of the multiple support members in each set comprises a plurality of data cables and at least one power cable such that each data cable of said plurality of data cables is configured to transmit data and each power cable of said at least one power cable is configured to transmit power, wherein the support structure further comprises a plurality of interconnect adapters;

wherein the corresponding support members in successive sets of multiple support members that are aligned directly above or below each other are mechanically coupled to each other by being in direct mechanical connection with respective opposite ends of an interconnect adapter of the plurality of interconnect adapters, wherein each interconnect adapter has an axis of rotation;

wherein each interconnect adapter comprises a first half and a second half in respective mechanical connection with the first structural member and the second structural member;

wherein the first half of each interconnect adapter is configured to be rotated in a first direction with respect to the axis of rotation;

wherein the second half of each interconnect adapter is configured to be rotated in a second direction with respect to the axis of rotation; and wherein the second direction is opposite the first direction.

* * * * *